(12) United States Patent
Qureshi

(10) Patent No.: US 11,165,401 B2
(45) Date of Patent: Nov. 2, 2021

(54) DYNAMIC AND SELF-ADJUSTING MICROPHONE GAIN FOR VOICE-ENABLED DEVICES

(71) Applicant: Hourglass Software LLC, Dover, DE (US)

(72) Inventor: Faisal Qureshi, Seattle, WA (US)

(73) Assignee: HOURGLASS SOFTWARE LLC, Dover, DE (US)

( * ) Notice: Subject to any disclaimer, the term of this patent is extended or adjusted under 35 U.S.C. 154(b) by 0 days.

(21) Appl. No.: 16/901,724

(22) Filed: Jun. 15, 2020

(65) Prior Publication Data

US 2021/0305960 A1  Sep. 30, 2021

Related U.S. Application Data

(60) Provisional application No. 63/002,918, filed on Mar. 31, 2020.

(51) Int. Cl.
*H03G 7/06* (2006.01)
*G10L 21/034* (2013.01)
*H04R 3/00* (2006.01)

(52) U.S. Cl.
CPC ............. *H03G 7/06* (2013.01); *G10L 21/034* (2013.01); *H04R 3/00* (2013.01)

(58) Field of Classification Search
CPC ......... H03G 7/06; G10L 21/034; G10L 15/20; G10L 15/22; G10L 2021/02166; G10L 21/0232; G10L 2015/223; G10L 21/0208; G10L 25/21; G10L 15/28; G10L 25/78; G10L 21/0364; G10L 25/84; G10L 15/26; G10L 17/00; G10L 2015/225; G10L 2021/02082; G10L 2021/02161; G10L 21/02; G10L 21/0216; G10L 2015/088; G10L 2015/226; G10L 21/0272; G10L 21/0316; G10L 25/57; G10L 15/34; G10L 17/22; G10L 2021/02165; G10L 2025/783; G10L 2025/786; G10L 13/02; G10L 13/047; G10L 13/08; G10L 15/00; G10L 15/005; G10L 15/063; G10L 15/30; G10L 2015/0635; G10L 21/06; G10L 25/30; G10L 25/48; G10L 25/87; H04R 3/00; H04R 29/004; H04R 19/04; H04R 1/245; H04R 1/326; G06F 3/165
See application file for complete search history.

(56) References Cited

U.S. PATENT DOCUMENTS 8,386,247 B2   2/2013  Yang et al.
2005/0276425 A1* 12/2005  Forrester ................. H04M 1/03
                                                 381/104

(Continued)

*Primary Examiner* — Akelaw Teshale
(74) *Attorney, Agent, or Firm* — Amin, Turocy & Watson, LLP

(57) ABSTRACT

Various acoustic manipulation and microphone gain adjustment techniques are enabled. For instance, a method comprises receiving, by a voice-enabled device comprising a processor and from a microphone, an input comprising environmental audio, determining, by the voice-enabled device, a level of the environmental audio, determining, by the voice-enabled device, a gain-adjust value based on the environmental audio, and adjusting, by the voice-enabled device, a gain of the microphone by the gain-adjust value.

20 Claims, 16 Drawing Sheets

(56) References Cited

U.S. PATENT DOCUMENTS

| | | | | |
|---|---|---|---|---|
| 2007/0253578 | A1* | 11/2007 | Verdecanna | H04M 1/6008 |
| | | | | 381/104 |
| 2009/0293109 | A1* | 11/2009 | Chu | H04L 63/101 |
| | | | | 726/6 |
| 2014/0270200 | A1* | 9/2014 | Usher | G10L 25/78 |
| | | | | 381/57 |
| 2015/0364145 | A1* | 12/2015 | Keller | G10L 21/0208 |
| | | | | 704/205 |
| 2018/0321905 | A1* | 11/2018 | Fountaine | G06F 3/167 |
| 2019/0043521 | A1* | 2/2019 | Maziewski | G06F 3/165 |
| 2019/0147875 | A1* | 5/2019 | Stemmer | G10L 15/22 |
| | | | | 704/257 |

\* cited by examiner

DYNAMIC AND SELF-ADJUSTING MICROPHONE GAIN FOR VOICE-ENABLED DEVICES

CROSS REFERENCE TO RELATED APPLICATION

The subject patent application claims priority to U.S. Provisional Patent Appln. No. 63/002,918, filed Mar. 31, 2020, entitled "Dynamic and Self-adjusting Microphone Gain for Voice-Enabled Devices". The entirety of the aforementioned application is hereby incorporated by reference herein.

TECHNICAL FIELD

The present disclosure generally relates to acoustic manipulation involving voice-enabled devices and microphone gain adjustment for voice-enabled devices.

BACKGROUND

The quantity and variety of devices supporting voice input continues to grow. Voice interaction and command, when well-implemented, facilitates organic interaction between man and machine. Communicating with devices by voice reduces touch fatigue in a world where touch screen interaction is increasingly commonplace. Voice control can also be significantly faster than a touch user interface (UI) for conveying an input to a device. Unfortunately, despite the incredible promise of voice control, some drawbacks exist. Notably, voice-enabled devices and systems tend to struggle in noisy environments, as background noise can reduce a device's ability to recognize human voice. This can become particularly frustrating because it is frequently impossible to reduce background noise, thus forcing users to raise their voices or even yell over background noise in an attempt to get their voice-enables devices to hear them.

Presently available voice-enabled devices, at best, provide lackluster results with respect to voice recognition in noisy environments. Some systems rely on software to attempt to decipher spoken input from background noise. However, such software is complicated, expensive to create and implement, and can consume a significant amount of power. These shortcomings can be burdensome with respect to consumer/industrial electronics and mobile devices. Therefore, there exists a need for improved voice-recognition, particularly in noise environments, which reduces cost and power consumption.

The above-described background relating to voice control and acoustic manipulation is merely intended to provide a contextual overview of some current issues and is not intended to be exhaustive. Other contextual information may become further apparent upon review of the following detailed description.

SUMMARY

The following summary is a general overview of various embodiments disclosed herein and is not intended to be exhaustive of limiting upon the disclosed embodiments. Embodiments are better understood upon consideration of the detailed description below in conjunction with the accompanying drawings and claims.

In one embodiment, a method is described herein. The method comprises receiving, by a voice-enabled device comprising a processor and from a microphone, an input comprising environmental audio, determining, by the voice-enabled device, a level of the environmental audio, determining, by the voice-enabled device, a gain-adjust value based on the environmental audio, and adjusting, by the voice-enabled device, a gain of the microphone by the gain-adjust value.

In another embodiment, a non-transitory machine-readable medium is described herein. The non-transitory machine-readable medium comprises executable instructions that, when executed by a processor of a voice-activated device, facilitate performance of operations, comprising: receiving, from a receiver comprising a pre-amplifier, a signal comprising environmental audio, determining a level of the environmental audio, determining a gain-adjust value based on the environmental audio, and adjusting a gain of the pre-amplifier, by the gain-adjust value.

In a further embodiment, a voice-enabled device is described herein. The voice-enabled device comprises: a processor, and a memory that stores executable instructions that, when executed by the processor, facilitate performance of operations, comprising: receiving, from an audio receiver, a signal comprising voice information and ambient noise, filtering the signal with a bandpass filter of the voice-enabled device, resulting in a filtered signal, determining a gain-adjustment value for the filtered signal, and applying the gain-adjustment value to an operational amplifier of the voice-enabled device, whereby the operational amplifier amplifies the signal.

BRIEF DESCRIPTION OF DRAWINGS

Various non-limiting embodiments of the subject disclosure are described with reference to the following figures, wherein like reference numerals refer to like parts throughout unless otherwise specified.

DETAILED DESCRIPTION

Figure 1:
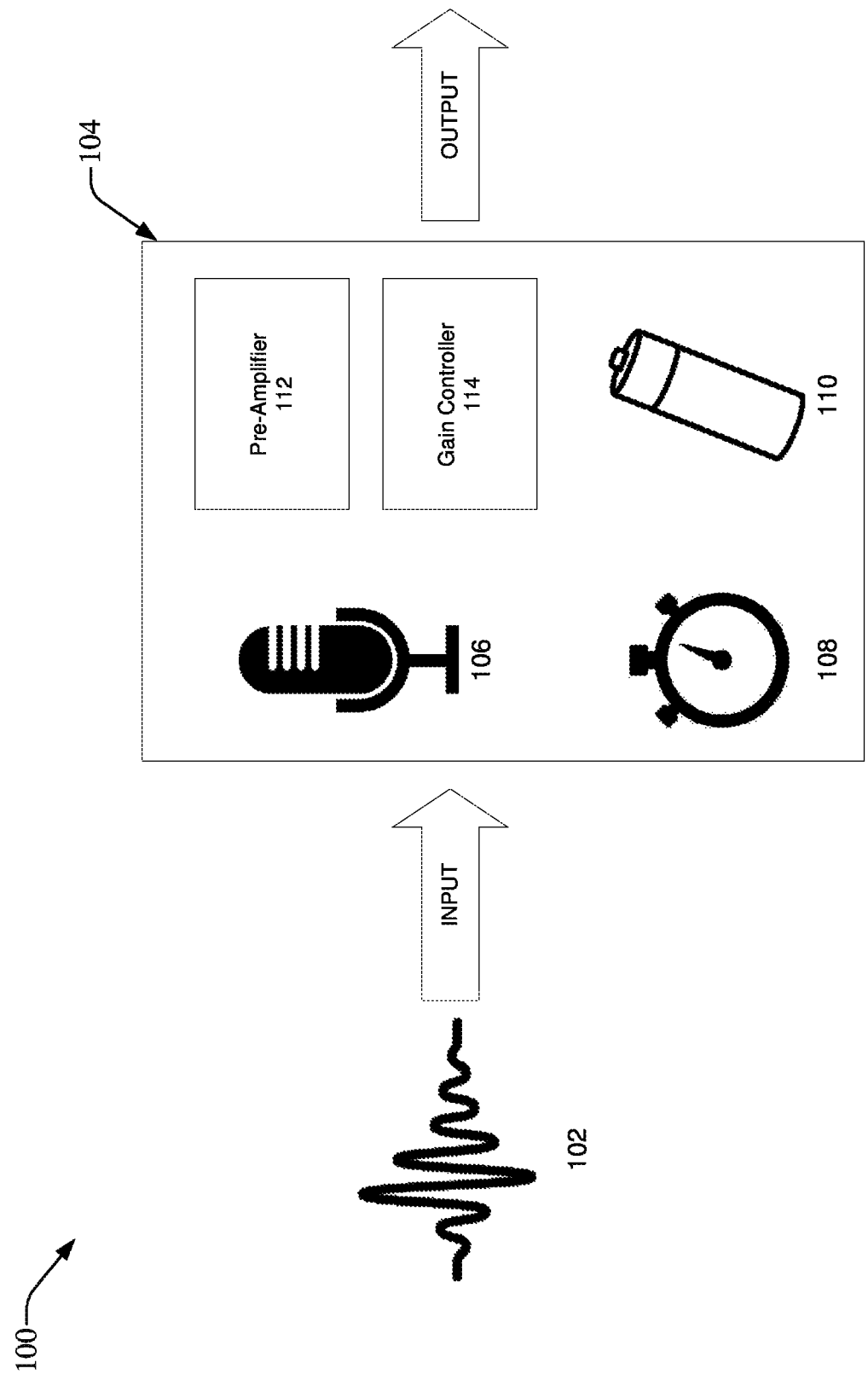
FIG. 1 is a diagram depicting systems and processes relating to voice control in accordance with one or more embodiments described herein.

Various specific details of the disclosed embodiments are provided in the description below. One skilled in the art will recognize, however, that the techniques described herein can in some cases be practiced without one or more of the specific details, or with other methods, components, materials, etc. In other instances, well-known structures, materials, or operations are not shown or described in detail to avoid obscuring certain aspects.

Embodiments described herein provide methods and systems that facilitate improved voice recognition or battery savings. Various embodiments herein can detect current noise and audio levels of an environment (e.g., from a microphone). Corresponding methods or systems can increase or decrease gain or volume input levels on the microphone. Raising gain can, for example, amplify input audio to better determine if a wake trigger has been uttered by a user. This can also make it easier for a user to speak in a native voice instead of raising his/her voice or "yelling" at a voice-enabled device in order for the device to clearly recognize a command. Lowering gain can, for example, save battery life by reducing power consumption of an associated device (e.g., a mobile device such as a smartphone). Embodiments described herein enable a user to speak in a native voice while being clearly understood by a voice-enabled device.

Gain value can be proportional to environmental audio levels (e.g., in decibels) with a difference to reach a nominal line level in a logarithmic model. Gain adjustments can be applied to a microphone's pre-amplifier or operational amplifier. In this regard, adjusting gain of a microphone can comprise adjusting the pre-amplifier. This self-adjustment can enable input audio to equivalent to a nominal line level (e.g., approx. +4 dBu).

Systems, machine readable media, methods, etc. described herein can facilitate continuous gain adjustment. Gain adjustment can occur at irregular or regular intervals or on a nonstop basis. For example, environmental audio can be sampled every ten seconds.

Gain can be lowered in response to a determination that a level of environmental audio is below a threshold value. This threshold value can be predetermined or can be user-defined. Conversely, gain can be increased in response to a determination that the level of environmental audio is above a threshold value.

Gain adjustment can occur on a frequency-by-frequency basis. For instance, an audio filter can be implemented to filter out frequencies known to not need gain adjustment or filter out frequencies known to not be relevant to voice control. Other embodiments can apply gain adjustment across all frequencies at once or most at once using, as an example, a mid-pass filter. Other filters can additionally or alternatively be utilized.

Various embodiments herein can include a second layer of self-adjustment to further improve voice recognition. For instance, after gain has been adjusted to enable spoken audio to be recognizable, gain can be further adjusted after recognizing spoken audio to further clarify the spoken audio. In this regard, the further adjustment (e.g., second-level adjustment) can further improve accuracy or recognition of spoken commands or prompts.

In other, various embodiments, voice-signatures can be registered to further improve voice recognition. In this regard, filtering and/or gain adjustment can be utilized in order to amplify a designated user's voice. For example, a household can comprise a plurality of members. However, it can be desirable for a device or system utilizing various techniques described herein to respond only to specific user(s). In this regard, a device or system described herein can amplify and/or process uttered voice from registered user(s) and/or disregard uttered voice from non-registered user(s) or user(s) registered to have their respective voices ignored. Registering frequencies of users can reduce undesired feedback from a voice-enabled device. Further, according to yet another embodiment, priorities can be assigned to registered users such that a voice-enabled system can determine which user to "listen" to in a situation during which multiple registered users speak at the same time. For example, persons in separate rooms may not realize that they are both attempting to communicate with a voice-enabled device and thus create a form of background noise for the other. A voice-enabled device can determine to which user to listen based on priority information. Priority information can be user programmable.

Technologies and techniques described herein can be implemented in a plethora of Internet of Things (IoT) devices ranging from smartphones, smartwatches, tablets, smart-glasses and other wearables, computers, household appliances, automobiles, marine or aeronautical applications, military applications, industrial equipment, etc.

The above aspects of the disclosure and/or other features of respective embodiments thereof are described in further detail with respect to the respective drawings below.

Turning now to FIG. 1, illustrated is a diagram 100 comprising a system 104. The system 104 can receive audio 102 as an input. The system 104 can comprise a microphone 106, a timer 108, a power source 110, a pre-amplifier 112, and a gain controller 114.

Audio 102 can comprise environmental audio, spoken audio, or both. It can be appreciated that environmental audio can also comprise spoken audio. Environmental audio can include background noise such as dogs barking, birds chirping, vehicle engines, appliances, music, television, distant conversations, wind noise, computer fans, etc. Background noise can also comprise undesirable spoken audio, such as a command uttered by a person not registered to use a voice-enabled device. In this regard, it can be appreciated that environmental audio often includes audio that is undesirable for voice-recognition which can impede voice recognition. Environmental audio sometimes comprises a mix of undesirable background noise and voice commands intended to be received and acted upon by a voice-control system (e.g., system 104).

Microphone 106 as described herein can employ a plurality of transducer types, such as condenser, dynamic, ribbon, carbon, piezoelectric, fiber-optic, laser, liquid microelectrical mechanical systems (MEMS), etc. Likewise, a variety of polar patterns can be implemented, such as omnidirectional, bi-directional, subcardioid, cardioid, hypercardioid, lobar, etc. A microphone 106 as described herein can be a subcomponent, as with system 104, or can be a standalone device. Further, a singularity or plurality of microphones 106 can be implemented in one or more embodiments described herein.

Timer 108 as described herein can comprise a standalone component or a subcomponent or module of a system (e.g., system 104). Timer 108 can enable the system 104 and/or microphone 106 to wait an amount of time (e.g., 5 seconds, 8 seconds, 10 seconds, 12 seconds, random interval, etc.) between determining levels of the audio 102. According to an embodiment, the timer 108 can facilitate pauses between sampling audio (e.g., audio 102). In this regard, longer pauses can reduce power consumption while shorter pauses can increase accuracy and facilitate improved adaptation to changing environmental conditions.

Power source 110 can supply power to a system 104 or another device described herein or as would otherwise be recognized by one skilled in the art. Power source 110 can comprise a battery (e.g., lead-acid, lithium-ion, nickel-cadmium, nickel metal hydride, alkaline, carbon zinc, mercury, silver oxide, etc.), a capacitor, or can comprise power from an external source such as from a conventional wall-outlet, electromagnetic induction, electromagnetic resonance, radio frequencies, etc.

Pre-amplifier 112 ("preamp 112") can be a subcomponent of the microphone 106, subcomponent of a gain controller 114, subcomponent of a system 104, or can be a standalone component. Gain can be increased or decreased by preamp 112 or gain controller 114 on audio 102 received by the microphone 106. In this regard, the preamp 112 or gain controller 114 can adjust input audio to reach a nominal line level (e.g., approx. +4 dBu).

Gain can be adjusted on filtered or unfiltered audio signals. In this regard, certain frequencies can be filtered out by an audio filter (e.g., low-pass, high-pass, bandpass, all-pass, etc.) before or after gain adjustment. A system 104 can comprise such a filter or a filter can be a component of system 104, subcomponent in a system 104, or can be a standalone component. Various frequencies can be scaled differently using filters to differentiate between frequencies for further processing (e.g., gain adjustment). For instance, it may be undesirable to permit children of a household to interact with some or all features of a voice-enabled device. Filtering for frequencies associated with children can prevent (or enable) gain adjustment on such frequencies.

According to an embodiment, a system 104 can receive an input of audio 102 via a microphone 106. The audio 102 can be previously filtered or can be unfiltered. The system 104 can determine a level in dBu. The system 104 can then adjust gain based on a determination regarding the gain adjustment needed to allow a spoken command to be clearly recognized. The system 104 can adjust the gain by the determined value. The system 104 can generate an output. The output can comprise the audio 102 as filtered and/or gain-adjusted by the system 104.

The foregoing can occur according to the following equation:

$$D=C+((E-Q)-G) \quad \text{Eq. (1)}$$

where:

D=gain-adjust value (in dBu)
C=gain-value to hear clearly in a quiet room (in dBu)
E=Environmental audio level (in dBu)
Q=Quiet room audio level (in dBu)
G=Current gain value (in dBu)

The gain-adjust value (D) can represent a value by which a system 104 or another component adjusts a microphone (e.g., microphone 106) gain by.

The gain-value to hear clearly in a quiet room (C) can represent a gain value that would ordinarily be sufficient to enable spoken commands to be clearly recognized or identified by a system 104 or another component or device. (C) can be predetermined or can be user-programmed. According to an example, (C) can be determined during a setup procedure of a voice-enabled device (e.g., system 104, or another device later discussed or as would be understood by one skilled in the art).

The environmental audio level (E) can represent a presently or recently determined audio level of environmental audio (e.g., audio 102). As previously discussed, this can be received or determined according to an interval by the system 104 or another component or device.

The quiet room audio level (Q) can comprise a predetermined threshold audio level representative of what has been designated a quiet mode for a room in which the environmental audio is minimized or substantially minimized. (Q) can be predetermined or can be user-programmed. According to an example, (Q) can be determined during a setup procedure of a voice-enabled device (e.g., system 104, or another device later discussed or as would be understood by one skilled in the art).

The current gain value (G) can comprise a level at which gain is currently set or a level at which gain was previously adjusted to. For example, (G) can comprise a level from a previous interval.

Figure 2:
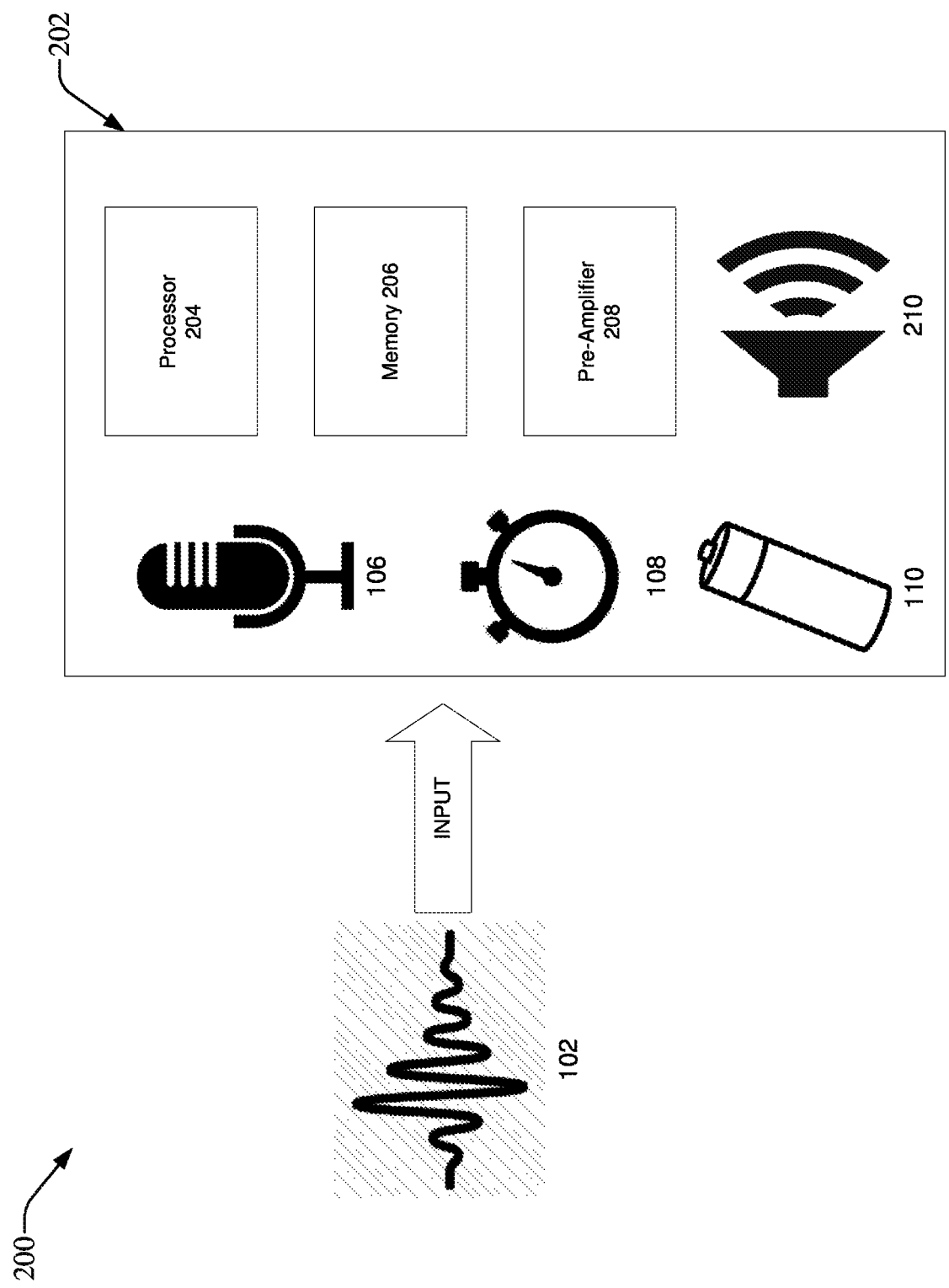
FIG. 2 is a diagram depicting systems and processes relating to voice control in accordance with one or more embodiments described herein.

Turning now to FIG. 2, illustrated is a diagram 200 comprising a system 202. The system 202 can comprise a processor 204, memory 206, preamp 208, speaker 210, microphone 106, timer 108, and power source 110.

System 202 can comprise, for instance, a smart-speaker device which can interact with a user primarily over audio, though physical controls can also be separately or cooperatively utilized. In this regard, a user can verbally communicate or interact with the system 202.

The processor 204 can execute instructions from a memory 206 that facilitate performance of operations. For instance, timer 108 or microphone 106 can be operated or controlled by the processor 204. The memory 206 can store voice signatures. Such voice signatures can comprise frequencies, cadence, or other characteristics of an individual person or group of people. Voice signatures can be associated with persons registered to use a system 202. Similarly, voice signatures can be associated with persons not permitted to use a system 202. Voice signatures can be preconfigured on a system 202 or can be user-programmed. The memory 206 can also store various programs or configurations for signal processing. For instance, a system 202 can possess a plurality of modes. Such modes can comprise, for instance, a power-saving mode. A power-saving mode can reduce the rate of environmental sampling to reduce power consumption which can thereby prolong battery life of a system 202. Another mode can comprise an increased-accuracy mode which can comprise an increased rate of environmental sampling for increased accuracy and an improved user-experience.

Preamp 208 can be similar to preamp 112 or gain controller 114 or can have capabilities similar to a combination of preamp 112 and gain controller 114.

Speaker 210 can be a speaker internal to the system 202. Other embodiments can utilize an external speaker communicatively coupled to the system 202 or other system (e.g., system 104). Speaker 210 can enable the device 202 to prompt a user of the system 202 or otherwise provide a user of the system 202 with information.

Figure 3:
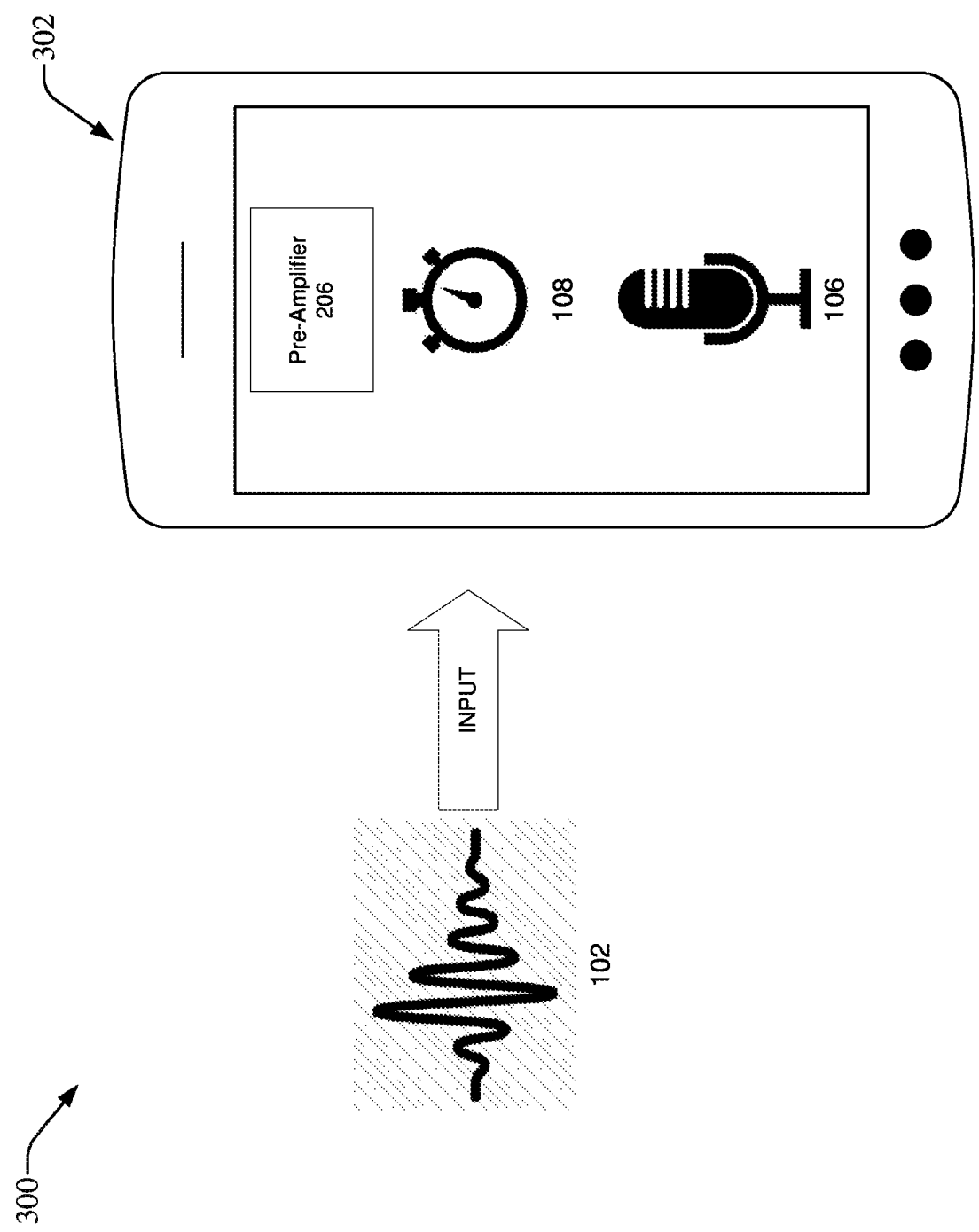
FIG. 3 is a diagram depicting systems and processes relating to voice control in accordance with one or more embodiments described herein.

With reference to FIG. 3, there is illustrated a diagram 300 comprising a mobile device 302. The mobile device 302 can comprise functionality similar to that of system 202 or functionality inherent to a traditional mobile device or smartphone (e.g., internal microphone 106, internal speaker, camera, touch screen, buttons, cellular radio, processor, memory, etc.). The mobile device 302 can comprise a preamp 206, a microphone 106, and a timer 108. The mobile device 302 can perform gain adjustment such that audio 102 can be clearly recognized. According to an embodiment, mobile device 302 (or system 104 or system 202) can perform a second layer of gain adjustment to further refine the clarity of spoken audio.

Figure 4:
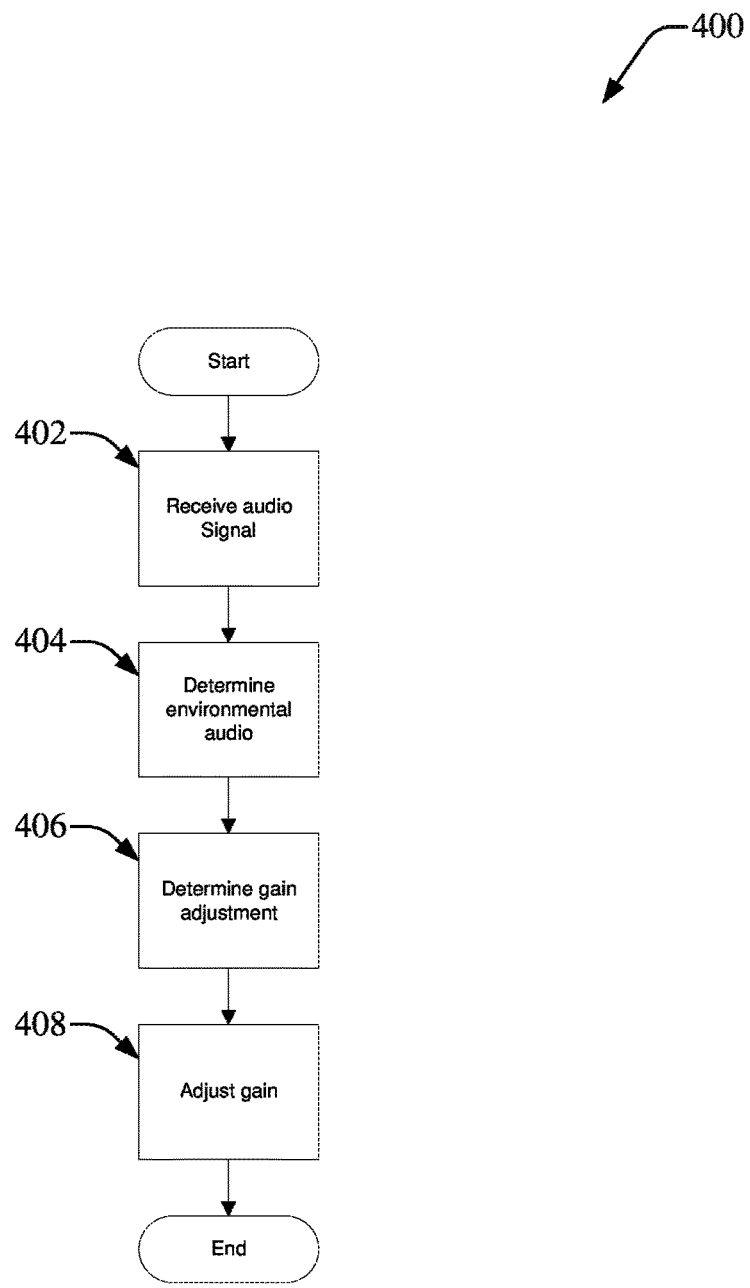
FIG. 4 is a flowchart of an example method for gain adjustment in accordance with one or more embodiments described herein.

Turning now to FIG. 4, a flowchart of a process 400 for gain control is shown. The process can be executed by, for instance, a system 104, system 202, mobile device 302, etc. At 402, an audio signal is received (e.g., via a microphone 106). According to an example, the audio signal received at 402 can be similar to audio signal 102. At 404, the audio signal (which can comprise environmental audio) is determined. In this regard, the environmental audio level can be evaluated to determine how much noise or background noise is present. At 406, gain adjustment is determined. Gain adjustment can be determined, for example, according to the above Eq. (1). At 408, gain can be adjusted according to the determination at 406.

Figure 5:
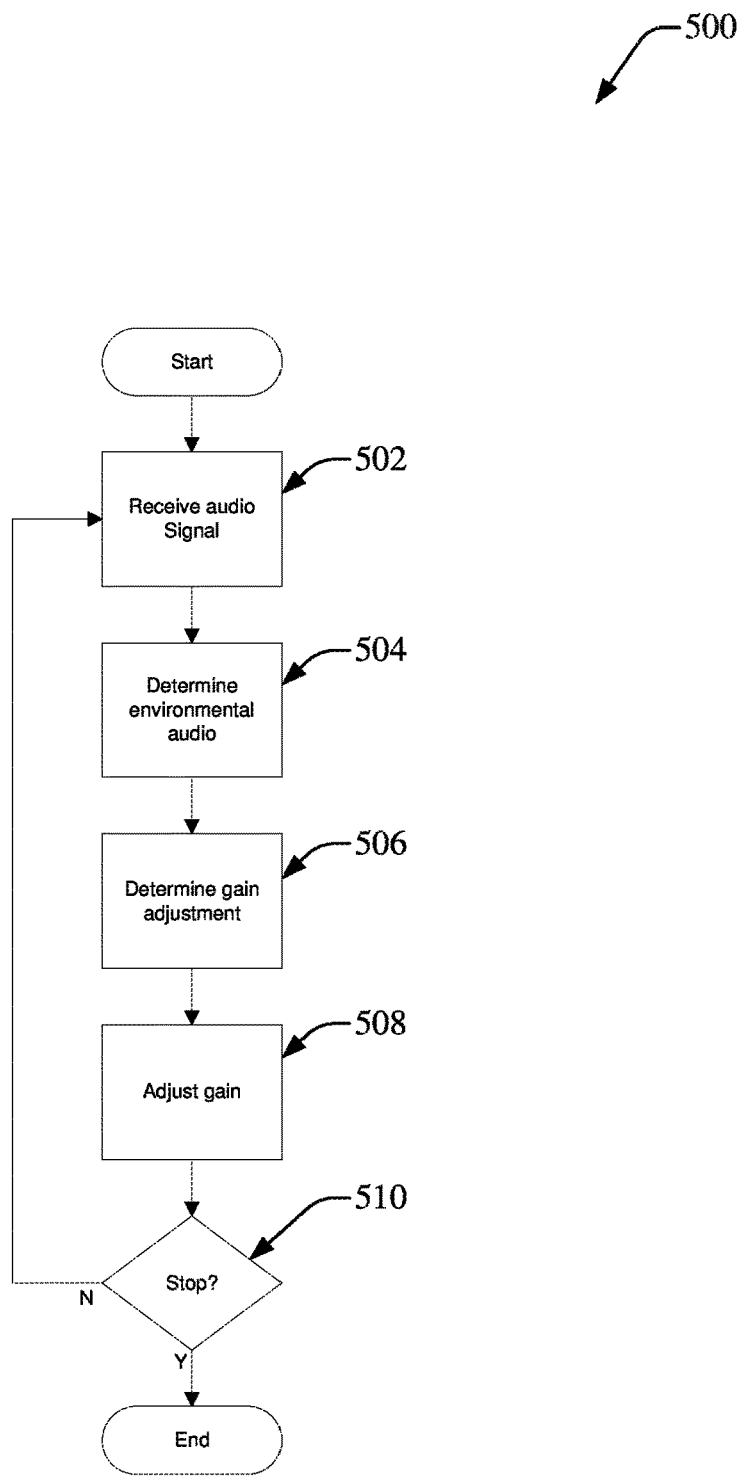
FIG. 5 is a flowchart of an example method for gain adjustment in accordance with one or more embodiments described herein.

FIG. 5 is a flowchart of a process 500 for gain control. At 502, an audio signal is received. At 504, environmental audio levels can be determined. At 506, gain adjustment is determined. At 508, gain can be adjusted according to the determination at 506. At 510, the process returns to 502 if the process does not stop. The process can continue (not stop) if the process is to make gain adjustments on a continuous basis or according to an interval. Intervals can vary depending on user-preferences (e.g., mode selection such as a power-saving mode or an increased-accuracy mode) or as determined by a system (e.g., system 104, system 202, mobile device 302, etc.) according to the level or variance of noise (e.g., background noise). For instance, substantially constant background noise or low level of background noise may only require a low interval rate. Conversely, highly variable background noise or a high level of background noise can require an increased interval rate. In this regard, it can be appreciated that various embodiments described herein can utilize time-intervals which are adjustable according to a measurement of at least one of an amount or a frequency of recent change in the environmental audio in a defined past period of time. At 510, the process can end if the process is to end after one gain adjustment. This can be according to a user preference or as determined by a system (e.g., system 104, system 202, mobile device 302, etc.).

Figure 6:
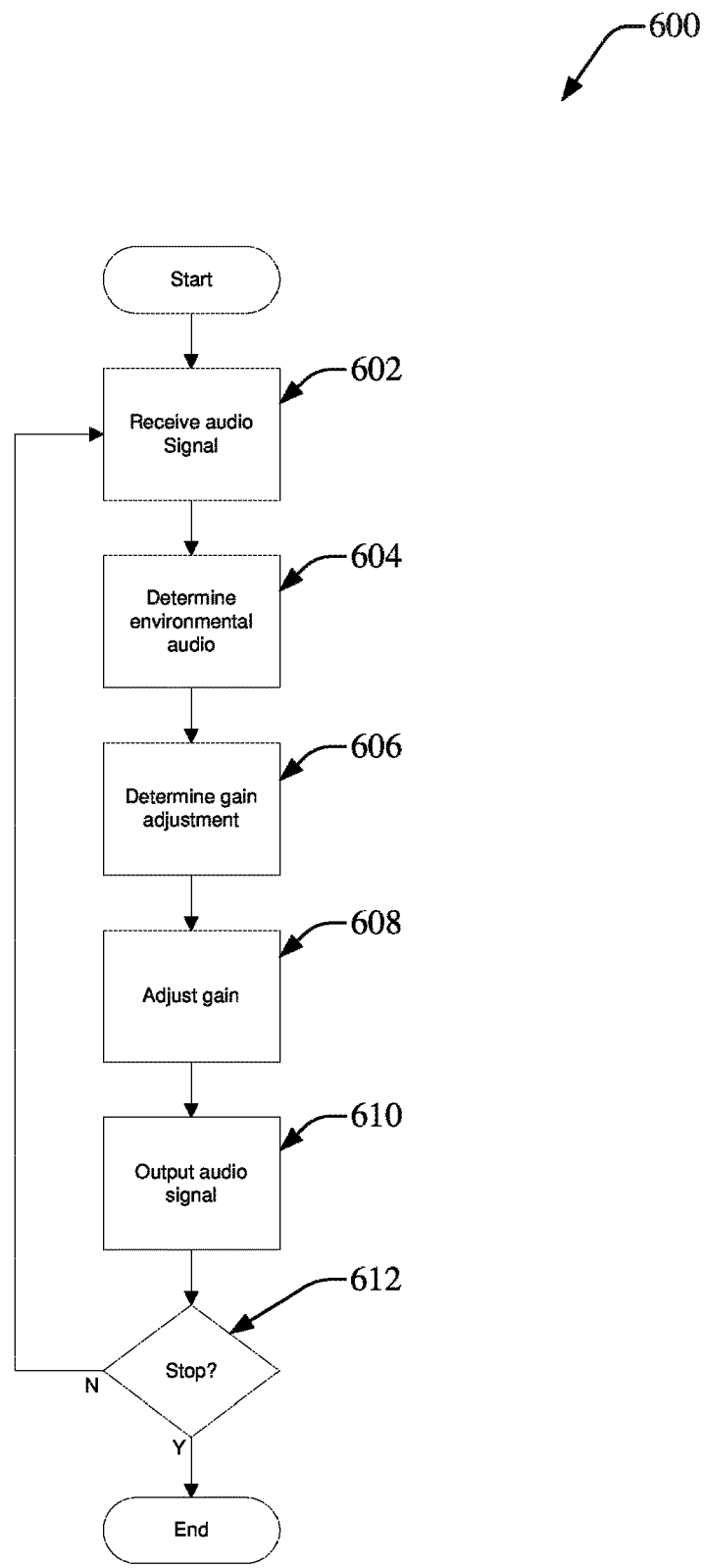
FIG. 6 is a flowchart of an example method for gain adjustment in accordance with one or more embodiments described herein.

Turning now to FIG. 6, there is illustrated a flowchart of a process 600 for gain control. At 602, an audio signal is received. At 604, environmental audio levels can be determined. At 606, gain adjustment is determined. At 608, gain can be adjusted according to the determination at 606. At 610, an audio signal can be output comprising a frequency or frequencies with adjusted gain. The audio signal can be output, for example, by a system 104, 202, or mobile device 302 to a separate module of the system 104, 202, or mobile device 302. In this regard, the system 104, 202, or mobile device 302 can determine voice commands based on the audio output to execute functions (e.g., play a song, dim a light, etc.). According to another embodiment, the audio can be output to an external system. In this regard, the audio can be output to a different device for further processing or uploaded to a server for processing. At 612, the process returns to 602 if the process does not stop. The process can continue (not stop) if the process is to make gain adjustments on a continuous basis or according to an interval. At 612, the process can end if the process is to end after one gain adjustment.

Figure 7:
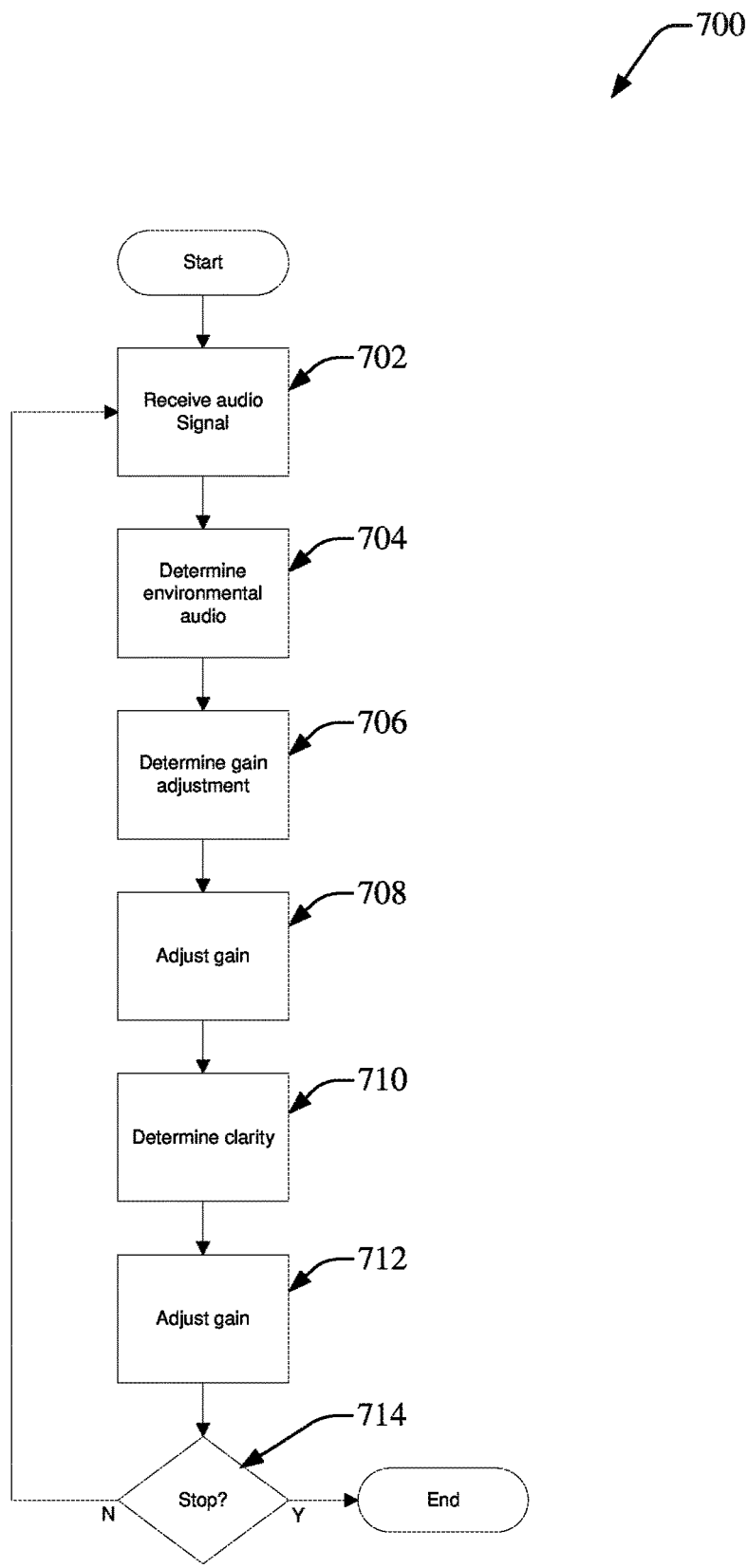
FIG. 7 is a flowchart of an example method for gain adjustment in accordance with one or more embodiments described herein.

Turning to FIG. 7, there is illustrated a flowchart of a process 700 for gain control. At 702, an audio signal is received. At 704, environmental audio levels can be determined. At 706, gain adjustment is determined. At 708, gain can be adjusted according to the determination at 706. At 710, clarity of audio having received gain adjustment at 708 can be determined. In this regard, the clarity can represent comprehensibility of the audio (e.g., gain-adjusted audio). At 712, gain can be further adjusted to refine the level of clarity. For instance, according to an embodiment, a first gain adjustment (e.g., at 708) can enable a device to receive a verbal cue. The second gain adjustment (e.g., at 712) can adjust the gain to accommodate frequencies associated with the user who gave a respective command. The second gain adjustment can be referred to as a second level or a second layer of adjustment or self-adjustment. At 714, the process returns to 702 if the process does not stop. The process can continue (not stop) if the process is to make gain adjustments on a continuous basis or according to an interval. At 714, the process can end if the process is to end after one loop of "double" gain adjustment (double gain adjustment can referred to a combination of or the result of the first gain adjustment and the second gain adjustment).

Figure 8:
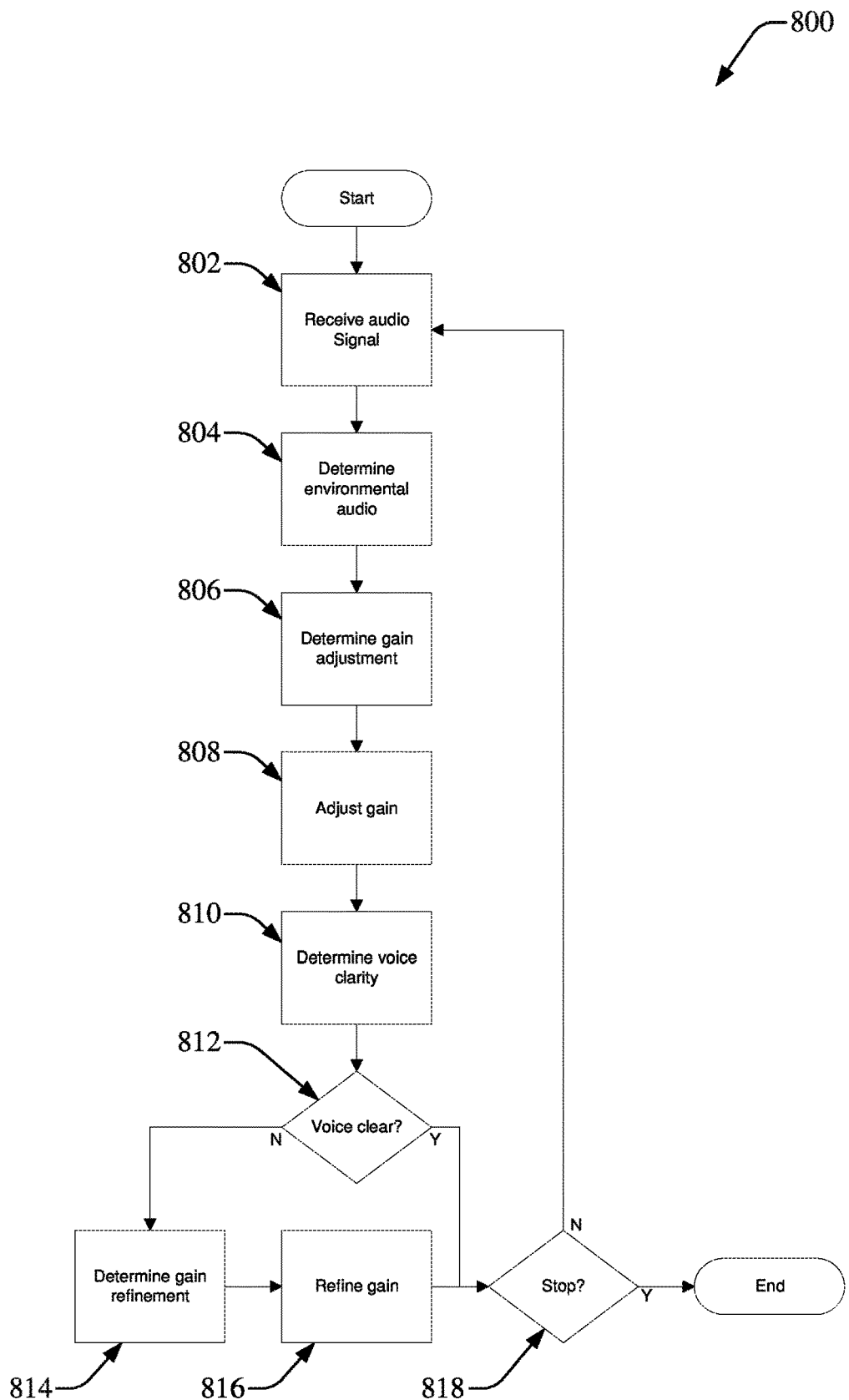
FIG. 8 is a flowchart of an example method for gain adjustment in accordance with one or more embodiments described herein.

With reference to FIG. 8, there is illustrated a flowchart of a process 800 for gain adjustment. At 802, an audio signal is received. At 804, environmental audio levels can be determined. At 806, gain adjustment is determined. At 808, gain can be adjusted according to the determination at 806. At 810, clarity of audio having received gain adjustment at 808 can be determined. At 812, the process proceeds to 814 if spoken words are not sufficiently clear to a system to enable a system to understand a user's spoken words without the user needing to raise his or her voice. At 814, gain refinement can be determined. At 816, the gain can be refined (e.g., further adjusted) according to the amount determined at 814. According to an example, steps 814 and 816 can be collectively referred to as a second gain-adjustment, second level, or second layer of gain adjustment or self-adjustment. The second gain-adjustment can occur according to, for example, Eq. (1). The process can then proceed to 818. At 812, the process proceeds to 818 if spoken words are sufficiently clear to a system to enable a system to understand a user's spoken words without the user needing to raise his or her voice. At 818, the process returns to 802 if the process does not stop. The process can continue (not stop) if the process is to make gain adjustments on a continuous basis or according to an interval. At 818, the process can end if the process is to end after one loop.

Figure 9:
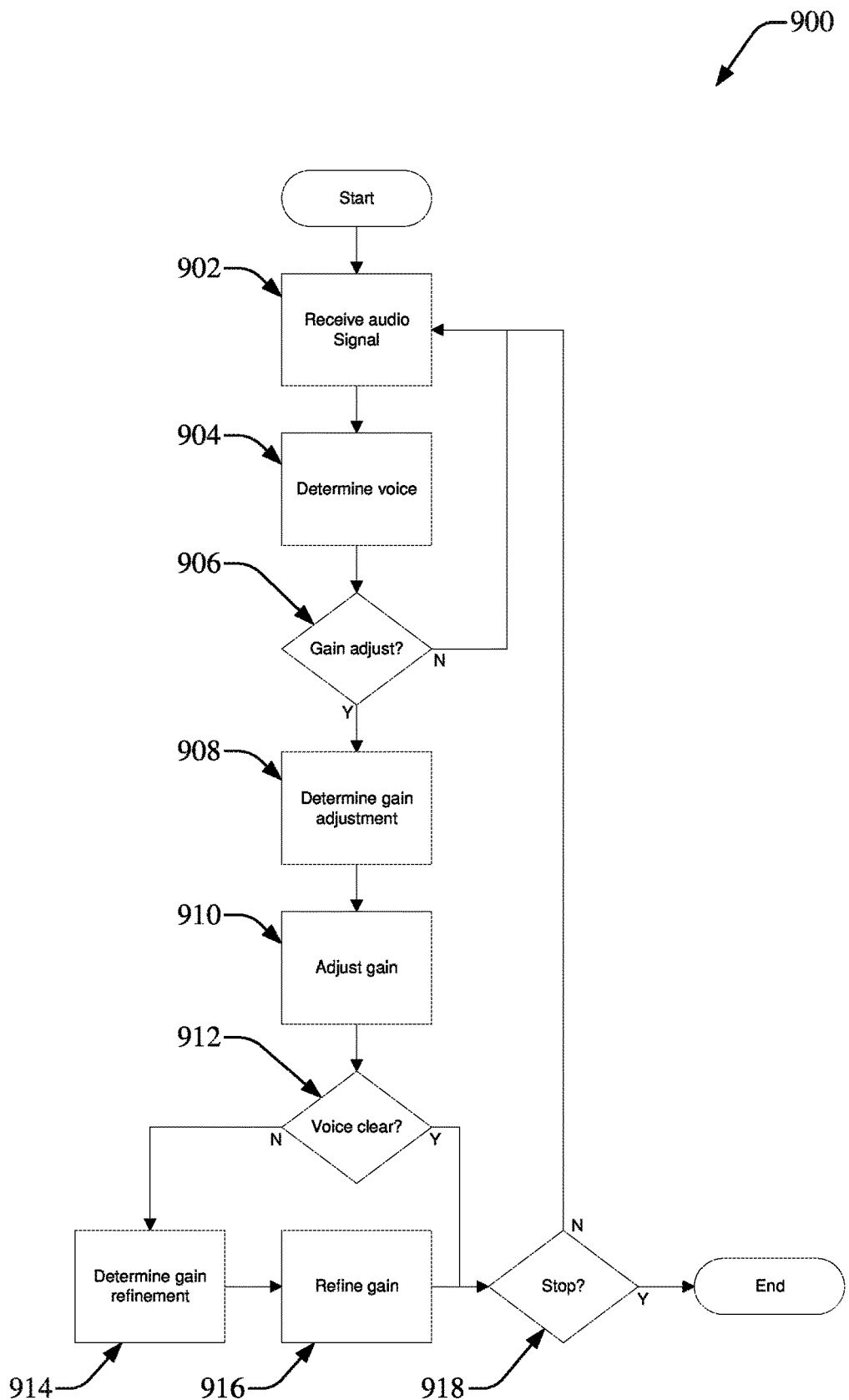
FIG. 9 is a flowchart of an example method for gain adjustment in accordance with one or more embodiments described herein.

FIG. 9 illustrates a flowchart of a process 900 for gain adjustment. At 902, an audio signal is received. At 904, it can be determined whether a voice exists or whether a gain adjustment is necessary to determine whether a voice exists.

At 904, it can additionally or alternatively be determined whether a voice is registered to provide commands to a system associated with the process 900. For instance, users can be registered or prohibited from providing commands via spoken voice to a system associated with the process 900. In this regard, gain adjustment can be applied only to users permitted to interact with said system. At 906, the process returns to 902 if no gain adjustment is necessary. At 906, the process proceeds to 908 if some gain adjustment is to be made. At 908, an amount of gain adjustment is determined. This adjustment can comprise an amount of adjustment in order to receive a spoken command or cue (e.g., a wakeup cue). At 910, gain is adjusted by the amount determined at 908. According to an example, 910 can represent a first gain adjustment. At 912, the process proceeds to 914 if a spoken command or cue is present but not clear. At 914, gain refinement is determined. At 916, the gain can be refined (e.g., further adjusted) according to the amount determined at 914. According to an example, 916 can represent a second gain adjustment. The process can then proceed to 918. At 912, the process proceeds to 918 if spoken words are sufficiently clear to a system to enable a system to understand a user's spoken words without the user needing to raise his or her voice. At 918, the process returns to 902 if the process does not stop. The process can continue (not stop) if the process is to make gain adjustments on a continuous basis or according to an interval. At 918, the process can end if the process is to end after one loop.

Figure 10:
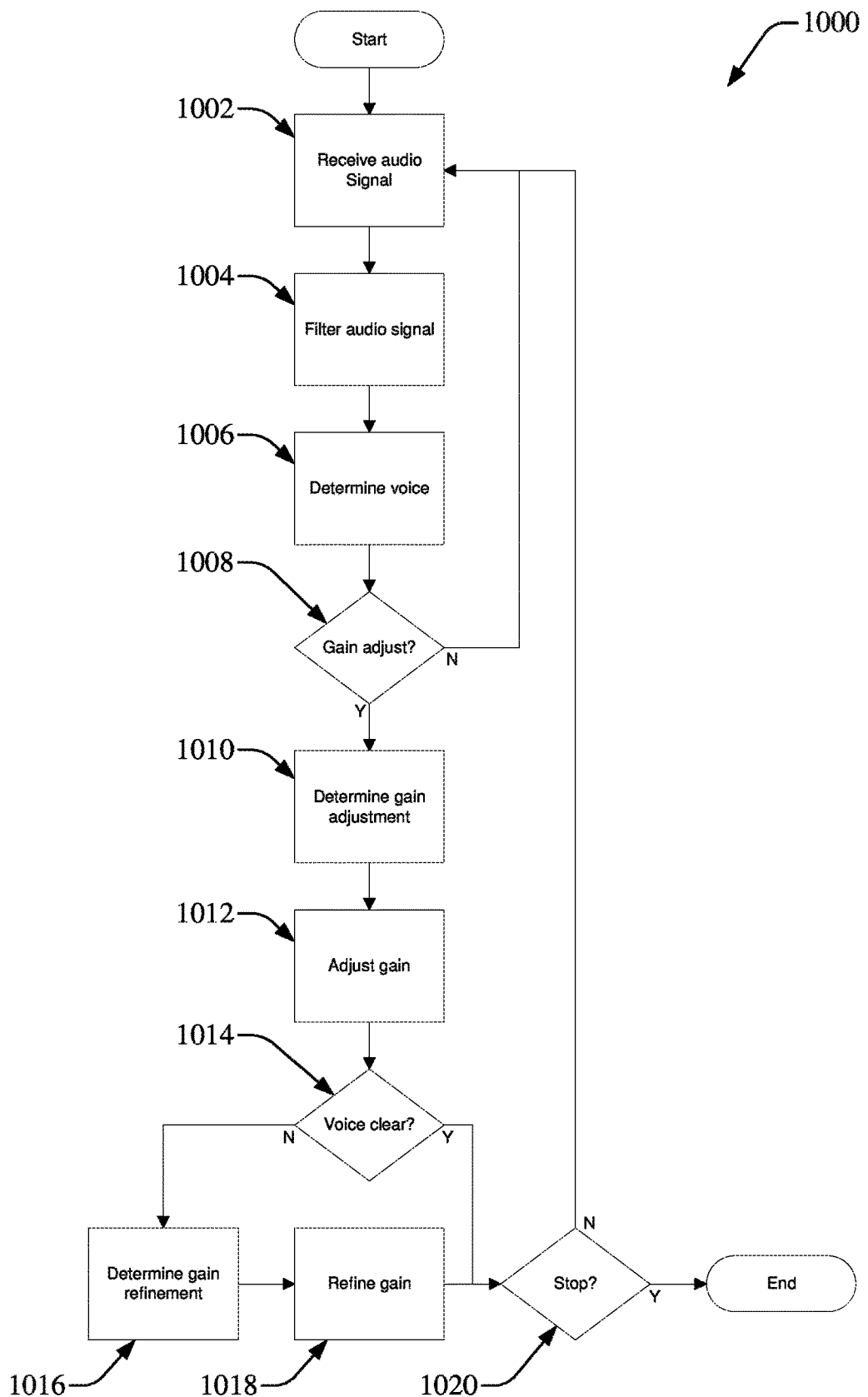
FIG. 10 is a flowchart of an example method for gain adjustment in accordance with one or more embodiments described herein.

Turning to FIG. 10, there is illustrated a flowchart of a process 1000 for gain adjustment. At 1002, an audio signal is received. At 1004, the audio signal received at 1002 can be filtered. Filtering at 1004 can enable gain adjustment to ultimately occur on only certain filtered or unfiltered frequencies. At 1006, it can be determined whether the audio signal comprises discernable voice. The determination can include determining whether a gain adjustment may be necessary to "hear" a voice command. At 1006, it can additionally or alternatively be determined whether a voice is registered to provide commands to a system associated with the process 1000. For instance, users can be registered or prohibited from providing commands via spoken voice to a system associated with the process 1000. In this regard, gain adjustment can be applied only to users permitted to interact with said system. At 1008, if no gain adjustment is determined to be made, the process returns to 1002. At 1008, if a gain adjustment is to be made, the process proceeds to 1010. At 1010, an amount of gain adjustment is determined. At 1012, gain is adjusted by the amount determined at 1010. If at 1014, voice is present and is determined to be clear, the process proceeds to 1020. If at 1014, voice is determined to not be clear, the process continues to 1016. At 1016, gain refinement is determined. At 1018, gain is refined by the amount determined at 1016. At 1020, if the process is to end, the process ends. At 1020, if the process is to continue (e.g., continuous audio monitoring and gain adjustment), the process returns to 1002.

Figure 11:
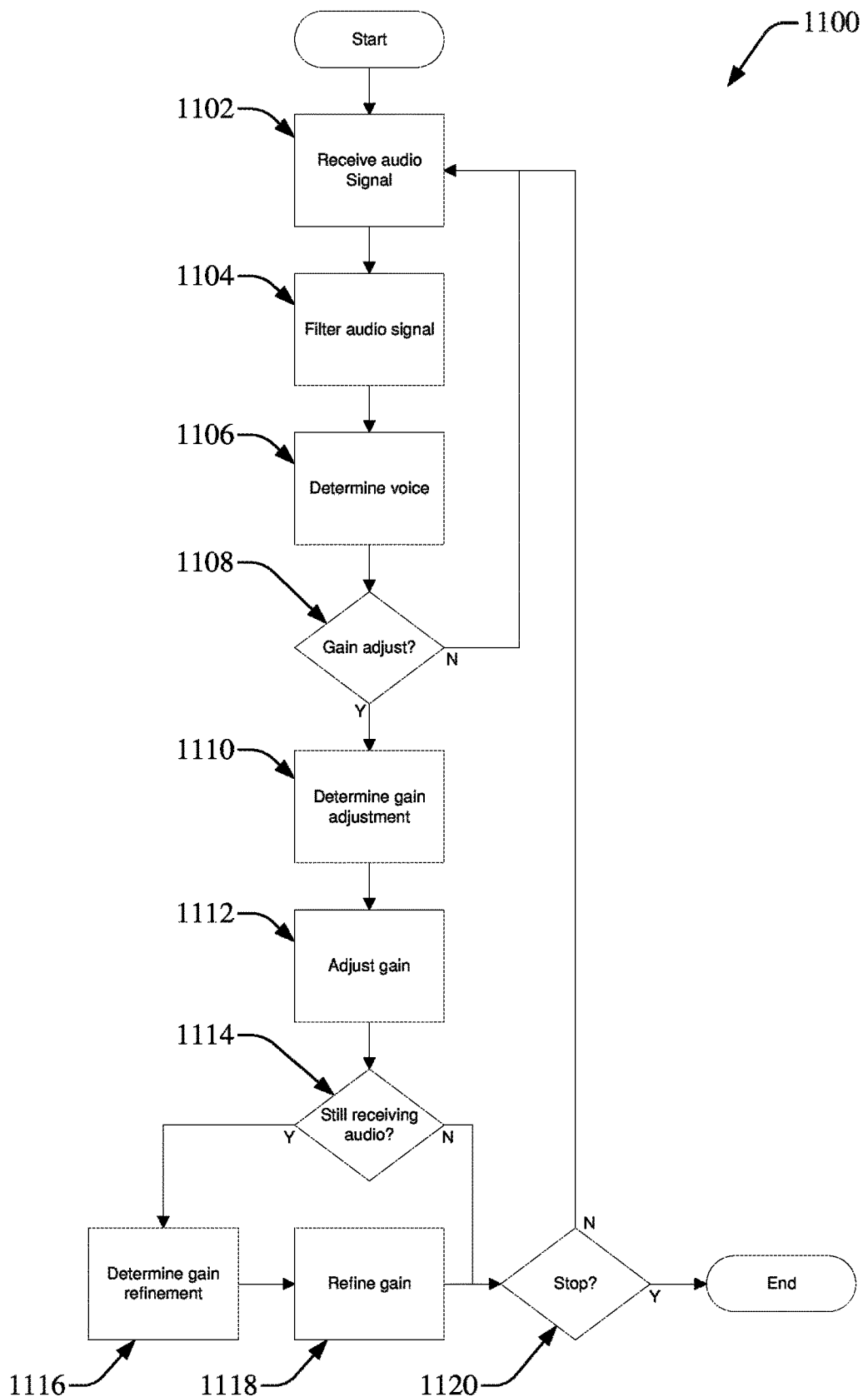
FIG. 11 is a flowchart of an example method for gain adjustment in accordance with one or more embodiments described herein.

Turning to FIG. 11, there is illustrated a flowchart of a process 1100 for gain adjustment. At 1102, an audio signal is received. At 1104, the audio signal received at 1102 can be filtered. Filtering at 1104 can enable gain adjustment to ultimately occur on only certain filtered or unfiltered frequencies. At 1106, it can be determined whether the audio signal comprises discernable voice. The determination can include determining whether a gain adjustment may be necessary to "hear" a voice command. At 1106, it can additionally or alternatively be determined whether a voice is registered to provide commands to a system associated with the process 1100. For instance, users can be registered or prohibited from providing commands via spoken voice to a system associated with the process 1100. In this regard, gain adjustment can be applied only to users permitted to interact with said system. At 1108, if no gain adjustment is determined to be made, the process returns to 1102. At 1108, if a gain adjustment is to be made, the process proceeds to 1110. At 1110, an amount of gain adjustment is determined. At 1112, gain is adjusted by the amount determined at 1110. If at 1114, audio is still being received, the process proceeds to 1116. This can occur, for example, during a long-spoken input. In this regard, a system can perform an initial adjustment such that a system is enabled to quickly adjust gain to hear the beginning of a spoken command, and if that command is long enough in duration, refine gain adjustment in real time to increase accuracy. According to an example, a system can, at 1112, adjust gain for a prompt (e.g., "hello system"), and then proceed to 1116 to determine gain refinement and then 1118 in order to refine gain adjustment for the remainder of the prompt (e.g., "what is the weather like today?"). The refinement determined at 1116 can, for example, be based on a determination of the clarity of the prompt adjusted at 1112. If at 1114, voice is no longer being received, the process continues to 1120. At 1116, gain refinement is determined. At 1118, gain is refined by the amount determined at 1116. At 1120, if the process is to end, the process ends. At 1120, if the process is to continue (e.g., continuous audio monitoring and gain adjustment), the process returns to 1102.

Figure 12:
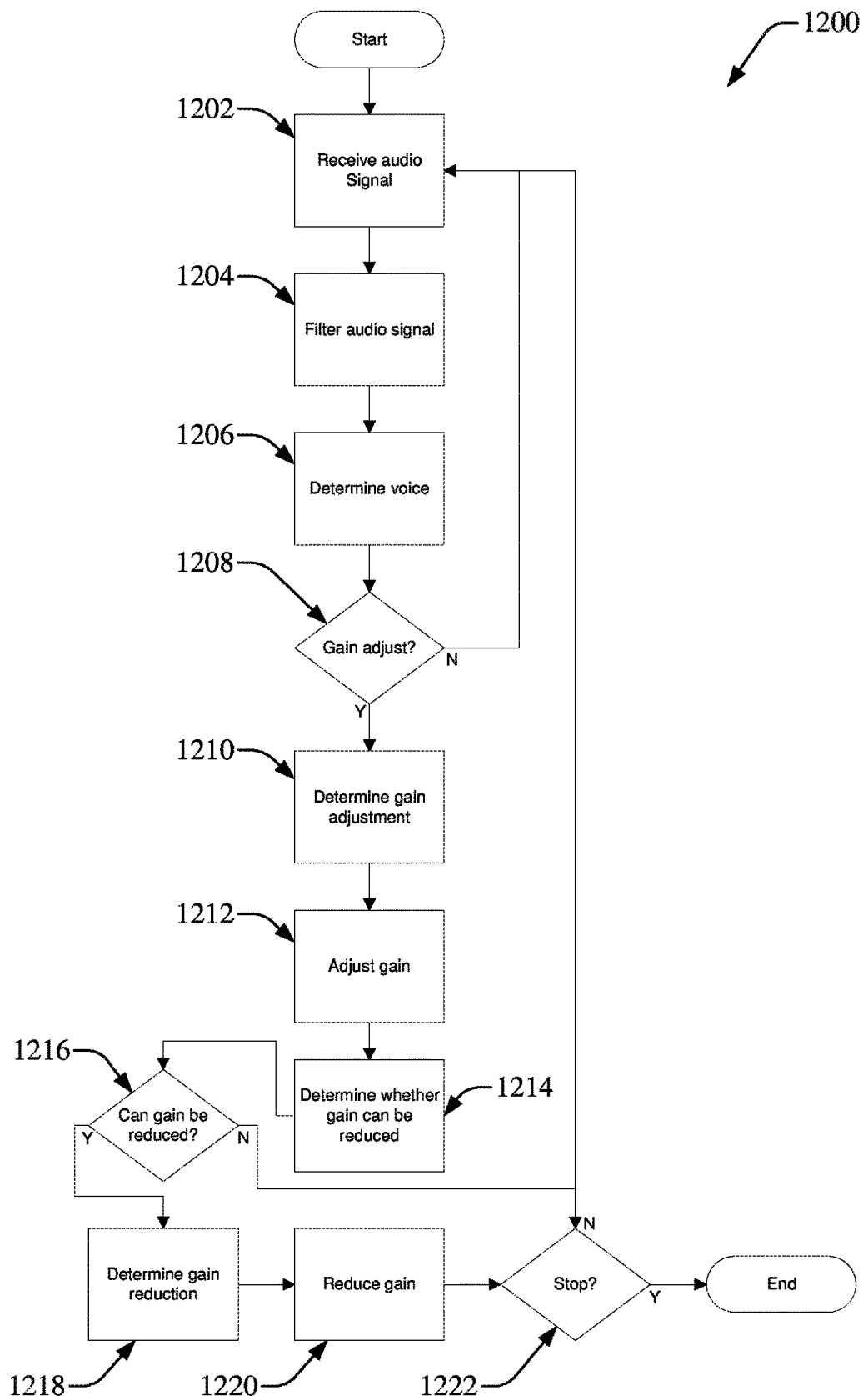
FIG. 12 is a flowchart of an example method for gain adjustment in accordance with one or more embodiments described herein.

With reference to FIG. 12, there is illustrated a flowchart of a process 1200 for gain adjustment. At 1202, an audio signal is received. At 1204, the audio signal received at 1202 can be filtered. Filtering at 1204 can enable gain adjustment to ultimately occur on only certain filtered or unfiltered frequencies. At 1206, it can be determined whether the audio signal comprises discernable voice. The determination can include determining whether a gain adjustment may be necessary to "hear" a voice command. At 1206, it can additionally or alternatively be determined whether a voice is registered to provide commands to a system associated with the process 1200. For instance, users can be registered or prohibited from providing commands via spoken voice to a system associated with the process 1200. In this regard, gain adjustment can be applied only to users permitted to interact with said system. At 1208, if no gain adjustment is determined to be made, the process returns to 1202. At 1208, if a gain adjustment is to be made, the process proceeds to 1210. At 1210, an amount of gain adjustment is determined. At 1212, gain is adjusted by the amount determined at 1210. At 1214, it is determined whether gain can be reduced. Reducing gain can, for instance, reduce power consumption which can improve battery life of a device utilizing process 1200. If at 1214, it is determined that gain cannot be reduced (e.g., current gain level necessary to clearly hear audio), the process proceeds from 1216 to 1222. If at 1214, it is determined that can be reduced (e.g., gain was over-adjusted or gain can be reduced while still maintaining clarity), the process can proceed from 1216 to 1218. At 1218, gain reduction is determined. At 1220, gain is reduced by the amount determined at 1218. At 1222, if the process is to end, the process ends. At 1222, if the process is to continue (e.g., continuous audio monitoring and gain adjustment), the process returns to 1202.

Figure 13:
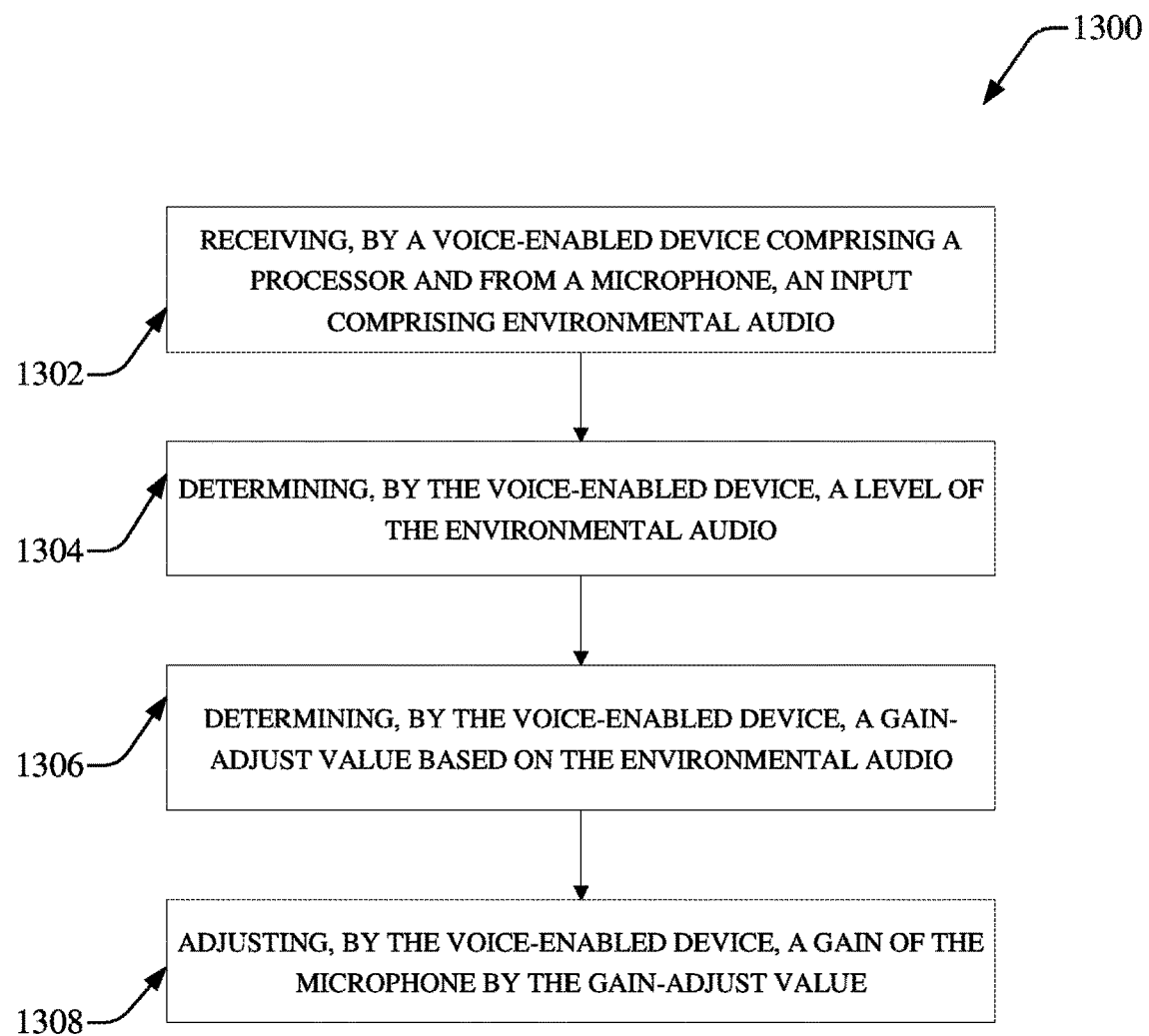
FIG. 13 is a block flow diagram for a method in which an input is received, and gain is ultimately adjusted in accordance with one or more embodiments described herein.

Turning next to FIG. 13, illustrated is a flow diagram of a process 1300 for gain adjustment in accordance with one or more embodiments described herein.

At 1302, a voice-enabled device comprising a professor receives, from a microphone, an input comprising environmental audio.

At 1304, the voice-enabled device determines a level of the environmental audio.

At 1306, the voice-enabled device determines a gain-adjust value based on the environmental audio.

At 1308, the voice-enabled device adjusts a gain of the microphone by the gain-adjust value.

Figure 14:
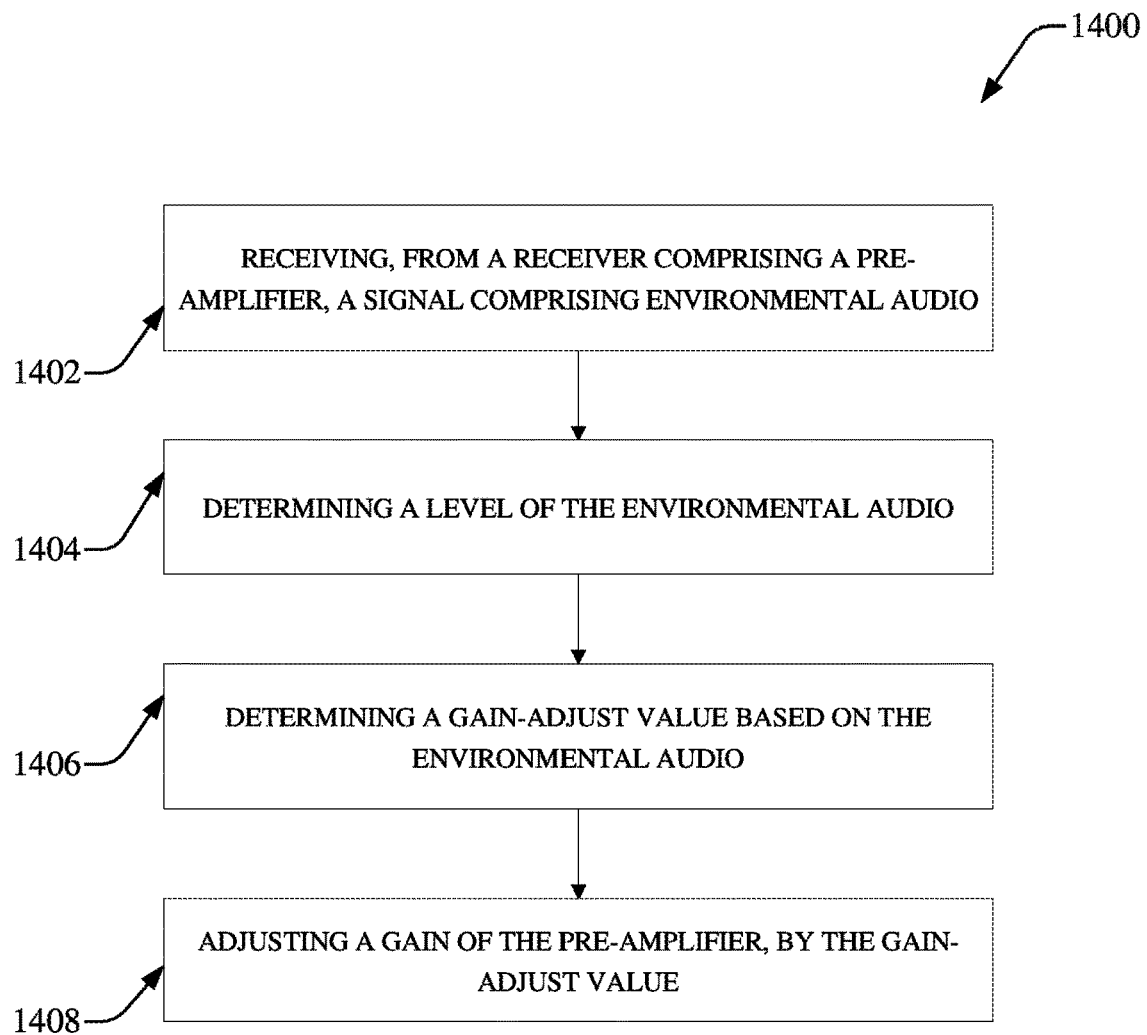
FIG. 14 is a block flow diagram for a method in which a signal is received, and gain is ultimately adjusted in accordance with one or more embodiments described herein.

FIG. 14 illustrates a flow diagram of a process 1400 for gain adjustment in accordance with one or more embodiments described herein.

At 1402, a signal comprising environmental audio is received from a received comprising a pre-amplifier.

At 1404, a level of the environmental audio is determined.

At 1406, a gain-adjust value is determined based on the environmental audio.

At 1408, a gain of the pre-amplifier is adjusted by the gain-adjust value.

It can be appreciated that a second signal comprising a human voice can be additionally received. A level of clarity of the human voice can be determined in response to adjusting a first gain-adjust value. A second gain-adjust value can be determined in order to increase the level of clarity of the human voice. In this regard, the pre-amplifier can be adjusted by the second gain-adjust value.

Figure 15:
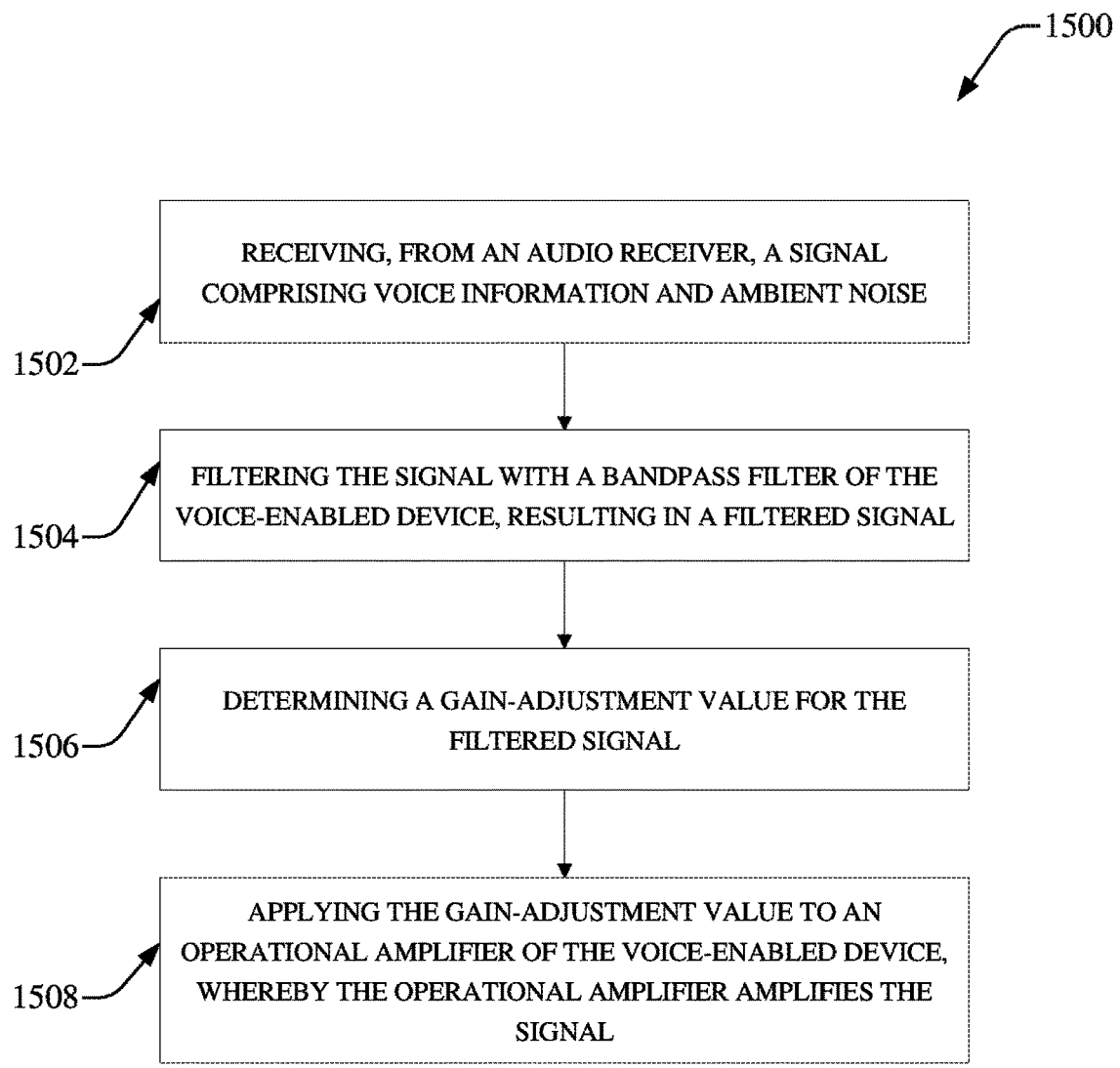
FIG. 15 is a block flow diagram for a method in which a signal is received, and gain is ultimately adjusted in accordance with one or more embodiments described herein.

FIG. 15 illustrates a flow diagram of a process 1500 for gain adjustment in accordance with one or more embodiments described herein.

At 1502, a signal comprising voice information and ambient noise is received from an audio receiver by a voice-enabled device.

At 1504, the signal is filtered with a bandpass filter of the voice-enabled device which results in a filtered signal.

At 1506, a gain-adjustment value is determined for the filtered signal.

At 1508, the gain-adjustment value is applied to an operational amplifier of the voice-enabled device, whereby the operational amplifier amplifies the signal.

FIGS. 4-15 as described above illustrate respective methods or systems in accordance with certain aspects of this disclosure. While, for purposes of simplicity of explanation, the methods or systems are shown and described as a series of acts, it is to be understood and appreciated that this disclosure is not limited by the order of acts, as some acts may occur in different orders and/or concurrently with other acts from those shown and described herein. For example, those skilled in the art will understand and appreciate that methods can alternatively be represented as a series of interrelated states or events, such as in a state diagram. Moreover, not all illustrated acts may be required to implement methods in accordance with certain aspects of this disclosure.

Figure 16:
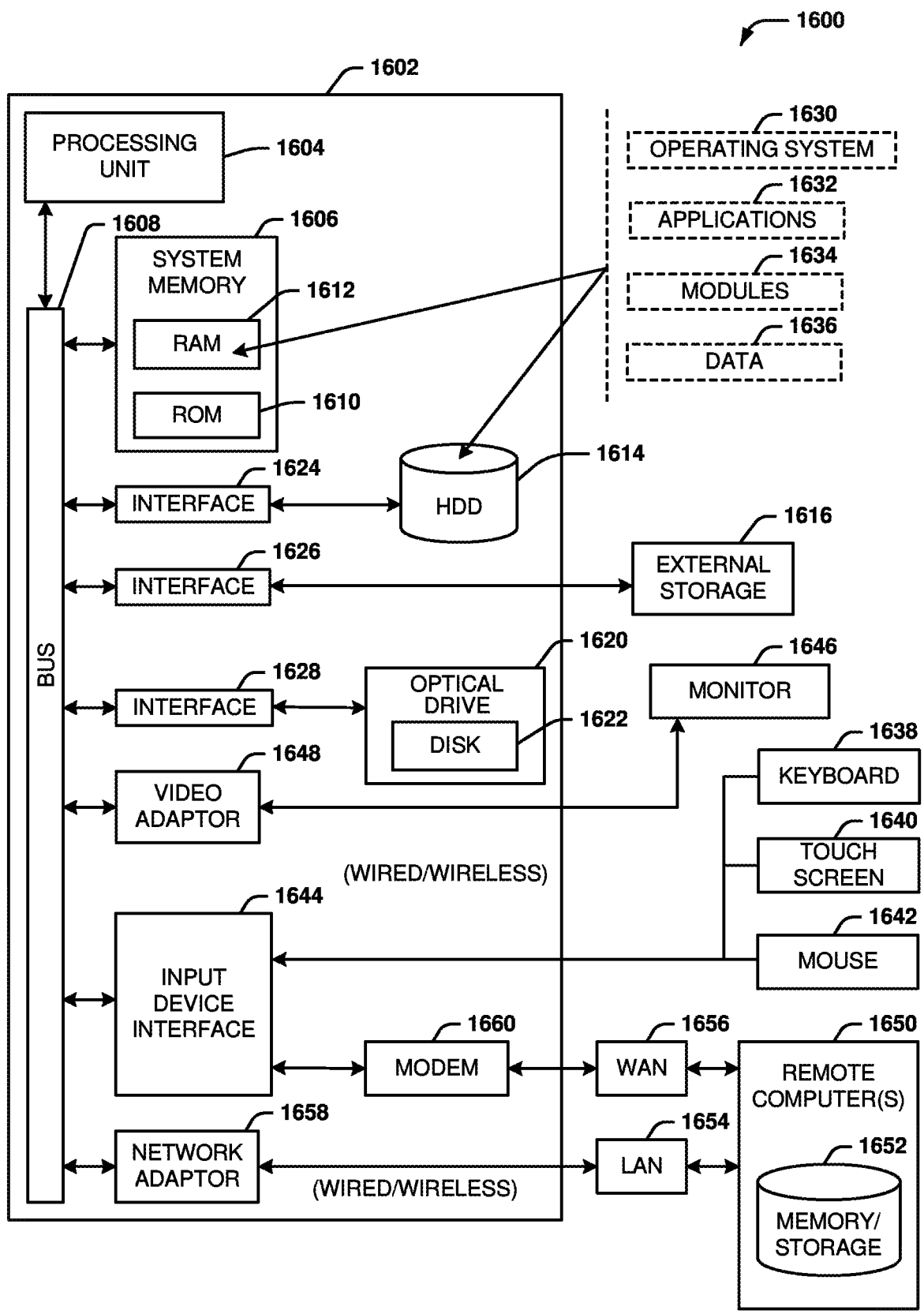
FIG. 16 is an example, non-limiting computing environment in which one or more embodiments described herein can be implemented.

In order to provide additional context for various embodiments described herein, FIG. 16 and the following discussion are intended to provide a brief, general description of a suitable computing environment 1600 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 16, the example environment 1600 for implementing various embodiments of the aspects described herein includes a computer 1602, the computer 1602 including a processing unit 1604, a system memory 1606 and a system bus 1608. The system bus 1608 couples system components including, but not limited to, the system memory 1606 to the processing unit 1604. The processing unit 1604 can be any of various commercially available processors. Dual microprocessors and other multi-processor architectures can also be employed as the processing unit 1604.

The system bus 1608 can be any of several types of bus structure that can further interconnect to a memory bus (with or without a memory controller), a peripheral bus, and a local bus using any of a variety of commercially available bus architectures. The system memory 1606 includes ROM 1610 and RAM 1612. A basic input/output system (BIOS) can be stored in a non-volatile memory such as ROM, erasable programmable read only memory (EPROM), EEPROM, which BIOS contains the basic routines that help to transfer information between elements within the computer 1602, such as during startup. The RAM 1612 can also include a high-speed RAM such as static RAM for caching data.

The computer 1602 further includes an internal hard disk drive (HDD) 1614 (e.g., EIDE, SATA), one or more external storage devices 1616 (e.g., a magnetic floppy disk drive (FDD) 1616, a memory stick or flash drive reader, a memory card reader, etc.) and an optical disk drive 1620 (e.g., which can read or write from a CD-ROM disc, a DVD, a BD, etc.). While the internal HDD 1614 is illustrated as located within the computer 1602, the internal HDD 1614 can also be configured for external use in a suitable chassis (not shown). Additionally, while not shown in environment 1600, a solid state drive (SSD) could be used in addition to, or in place of, an HDD 1614. The HDD 1614, external storage device(s) 1616 and optical disk drive 1620 can be connected to the system bus 1608 by an HDD interface 1624, an external storage interface 1626 and an optical drive interface 1628, respectively. The interface 1624 for external drive implementations can include at least one or both of Universal Serial Bus (USB) and Institute of Electrical and Electronics Engineers (IEEE) 1694 interface technologies. Other external drive connection technologies are within contemplation of the embodiments described herein.

The drives and their associated computer-readable storage media provide nonvolatile storage of data, data structures, computer-executable instructions, and so forth. For the computer 1602, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1612, including an operating system 1630, one or more application programs 1632, other program modules 1634 and program data 1636. All or portions of the operating system, applications, modules, and/or data can also be cached in the RAM 1612. The systems and methods described herein can be implemented utilizing various commercially available operating systems or combinations of operating systems.

Computer 1602 can optionally comprise emulation technologies. For example, a hypervisor (not shown) or other intermediary can emulate a hardware environment for operating system 1630, and the emulated hardware can optionally be different from the hardware illustrated in FIG. 16. In such an embodiment, operating system 1630 can comprise one virtual machine (VM) of multiple VMs hosted at computer 1602. Furthermore, operating system 1630 can provide runtime environments, such as the Java runtime environment or the .NET framework, for applications 1632. Runtime environments are consistent execution environments that allow applications 1632 to run on any operating system that includes the runtime environment. Similarly, operating system 1630 can support containers, and applications 1632 can be in the form of containers, which are lightweight, standalone, executable packages of software that include, e.g., code, runtime, system tools, system libraries and settings for an application.

Further, computer 1602 can be enable with a security module, such as a trusted processing module (TPM). For instance with a TPM, boot components hash next in time boot components, and wait for a match of results to secured values, before loading a next boot component. This process can take place at any layer in the code execution stack of computer 1602, e.g., applied at the application execution level or at the operating system (OS) kernel level, thereby enabling security at any level of code execution.

A user can enter commands and information into the computer 1602 through one or more wired/wireless input devices, e.g., a keyboard 1638, a touch screen 1640, and a pointing device, such as a mouse 1642. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1604 through an input device interface 1644 that can be coupled to the system bus 1608, but can be connected by other interfaces, such as a parallel port, an IEEE 1394 serial port, a game port, a USB port, an IR interface, a BLUETOOTH® interface, etc.

A monitor 1646 or other type of display device can be also connected to the system bus 1608 via an interface, such as a video adapter 1648. In addition to the monitor 1646, a computer typically includes other peripheral output devices (not shown), such as speakers, printers, etc.

The computer 1602 can operate in a networked environment using logical connections via wired and/or wireless communications to one or more remote computers, such as a remote computer(s) 1650. The remote computer(s) 1650 can be a workstation, a server computer, a router, a personal computer, portable computer, microprocessor-based entertainment appliance, a peer device or other common network node, and typically includes many or all of the elements described relative to the computer 1602, although, for purposes of brevity, only a memory/storage device 1652 is illustrated. The logical connections depicted include wired/wireless connectivity to a local area network (LAN) 1654 and/or larger networks, e.g., a wide area network (WAN) 1656. Such LAN and WAN networking environments are commonplace in offices and companies, and facilitate enterprise-wide computer networks, such as intranets, all of which can connect to a global communications network, e.g., the Internet.

When used in a LAN networking environment, the computer 1602 can be connected to the local network 1654 through a wired and/or wireless communication network interface or adapter 1658. The adapter 1658 can facilitate wired or wireless communication to the LAN 1654, which can also include a wireless access point (AP) disposed thereon for communicating with the adapter 1658 in a wireless mode.

When used in a WAN networking environment, the computer 1602 can include a modem 1660 or can be connected to a communications server on the WAN 1656 via other means for establishing communications over the WAN 1656, such as by way of the Internet. The modem 1660, which can be internal or external and a wired or wireless device, can be connected to the system bus 1608 via the input device interface 1644. In a networked environment, program modules depicted relative to the computer 1602 or portions thereof, can be stored in the remote memory/storage device 1652. It will be appreciated that the network connections shown are example and other means of establishing a communications link between the computers can be used.

When used in either a LAN or WAN networking environment, the computer 1602 can access cloud storage systems or other network-based storage systems in addition to, or in place of, external storage devices 1616 as described above. Generally, a connection between the computer 1602 and a cloud storage system can be established over a LAN 1654 or WAN 1656 e.g., by the adapter 1658 or modem 1660, respectively. Upon connecting the computer 1602 to an associated cloud storage system, the external storage interface 1626 can, with the aid of the adapter 1658 and/or modem 1660, manage storage provided by the cloud storage system as it would other types of external storage. For instance, the external storage interface 1626 can be configured to provide access to cloud storage sources as if those sources were physically connected to the computer 1602.

The computer 1602 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The illustrated aspects of the disclosure may also be practiced in distributed computing environments where certain tasks are performed by remote processing devices that are linked through a communications network. In a distributed computing environment, program modules can be located in both local and remote memory storage devices.

The above description includes non-limiting examples of the various embodiments. It is, of course, not possible to describe every conceivable combination of components or methods for purposes of describing the disclosed subject matter, and one skilled in the art may recognize that further combinations and permutations of the various embodiments are possible. The disclosed subject matter is intended to embrace all such alterations, modifications, and variations that fall within the spirit and scope of the appended claims.

With regard to the various functions performed by the above described components, devices, circuits, systems, etc., the terms (including a reference to a "means") used to describe such components are intended to also include, unless otherwise indicated, any structure(s) which performs the specified function of the described component (e.g., a functional equivalent), even if not structurally equivalent to the disclosed structure. In addition, while a particular feature of the disclosed subject matter may have been disclosed with respect to only one of several implementations, such feature may be combined with one or more other features of the other implementations as may be desired and advantageous for any given or particular application.

The terms "exemplary" and/or "demonstrative" as used herein are intended to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent structures and techniques known to one skilled in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

The term "or" as used herein is intended to mean an inclusive "or" rather than an exclusive "or." For example, the phrase "A or B" is intended to include instances of A, B, and both A and B. Additionally, the articles "a" and "an" as used in this application and the appended claims should generally be construed to mean "one or more" unless either otherwise specified or clear from the context to be directed to a singular form.

The term "set" as employed herein excludes the empty set, i.e., the set with no elements therein. Thus, a "set" in the subject disclosure includes one or more elements or entities. Likewise, the term "group" as utilized herein refers to a collection of one or more entities.

The description of illustrated embodiments of the subject disclosure as provided herein, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as one skilled in the art can recognize. In this regard, while the subject matter has been described herein in connection with various embodiments and corresponding drawings, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method, comprising:
    receiving, by a voice-enabled device comprising a processor and from a microphone, a first input comprising environmental audio;
    determining, by the voice-enabled device, a level of the environmental audio;
    determining, by the voice-enabled device, a first gain-adjust value based on the environmental audio;
    adjusting, by the voice-enabled device, a gain of the microphone by the first gain-adjust value;
    receiving, by the voice-enabled device, from the microphone, a second input comprising a human voice;

determining, by the voice-enabled device, a level of clarity of the human voice in response to adjusting the first gain-adjust value;

determining, by the voice-enabled device, a second gain-adjust value to increase the level of clarity of the human voice; and adjusting, by the voice-enabled device, the gain of the microphone by the second gain-adjust value.

2. The method of claim 1, wherein determining the level of the environmental audio repeatedly occurs according to a time-interval.

3. The method of claim 2, wherein the time-interval is adjustable according to a measurement of at least one of an amount or a frequency of recent change in the environmental audio in a defined past period of time.

4. The method of claim 1, further comprising:
determining, by the voice-enabled device, a noise level, wherein the noise level comprises a difference between the level of the environmental audio and a predetermined threshold audio level representative of what has been designated a quiet mode for a room in which the environmental audio is minimized or substantially minimized.

5. The method of claim 4, further comprising:
determining, by the voice-enabled device, a prior adjust value, wherein the prior adjust value comprises a difference between the noise level and a current gain value.

6. The method of claim 5, wherein determining the first gain-adjust value comprises a combination of a gain value required to distinguish voice information from the environmental audio and the prior adjust value.

7. The method of claim 1, wherein the microphone comprises a pre-amplifier, and wherein adjusting the gain of the microphone comprises adjusting the pre-amplifier.

8. The method of claim 1, wherein adjusting the gain comprises lowering the gain in response to a determination that the level of the environmental audio is below a threshold value.

9. The method of claim 1, wherein adjusting the gain comprising increasing the gain in response to a determination that the level of the environmental audio is above a threshold value.

10. The method of claim 1, wherein the second input comprising the human voice further comprises a voice command to execute a function of the voice-enabled device.

11. A non-transitory machine-readable medium, comprising executable instructions that, when executed by a processor of a device for which voice input is supported, facilitate performance of operations, comprising:
receiving, from a receiver comprising a pre-amplifier, a first signal comprising environmental audio;
determining a level of the environmental audio;
determining a first gain-adjust value based on the environmental audio;
adjusting a gain of the pre-amplifier, by the first gain-adjust value;
receiving, from the receiver, a second signal comprising a voice;
determining a level of clarity of the voice in response to adjusting the first gain-adjust value;
determining a second gain-adjust value that increases the level of clarity of the voice; and
adjusting the gain of the pre-amplifier by the second gain-adjust value.

12. The non-transitory machine-readable medium, of claim 11, wherein the operations further comprise:
a filter, wherein the filter suppresses a frequency range of the first signal comprising the environmental audio.

13. The non-transitory machine-readable medium of claim 12, wherein the frequency range comprises background noise.

14. The non-transitory machine-readable medium of claim 12, wherein the frequency range comprises a voice not registered with the device.

15. The non-transitory machine-readable medium of claim 11, wherein the operations further comprise:
determining whether the second signal comprises a voice registered with the voice-activated device; and
adjusting the gain of the pre-amplifier to amplify a frequency range associated with the voice.

16. The non-transitory machine-readable medium of claim 15, wherein the voice registered with the device is a first voice,
wherein adjusting the gain of the pre-amplifier to amplify the first voice comprises not amplifying a second frequency range associated with a second voice, and
wherein the second voice is not registered with the device.

17. A voice-enabled device, comprising:
a processor; and
a memory that stores executable instructions that, when executed by the processor, facilitate performance of operations, comprising:
receiving, from an audio receiver, a signal comprising voice information and ambient noise;
filtering the signal with a bandpass filter of the voice-enabled device, resulting in a filtered signal;
determining a first gain-adjustment value for the filtered signal;
applying the first gain-adjustment value to an operational amplifier of the voice-enabled device, whereby the operational amplifier amplifies the signal;
determining a level of clarity of the voice information in response to applying the first gain-adjustment value;
determining, a second gain-adjustment value to increase the level of clarity of the voice information; and
applying the second gain-adjustment value to the operational amplifier.

18. The voice-enabled device of claim 17, wherein the first gain-adjustment value is only applied to a frequency range determined to be associated with the voice information.

19. The voice-enabled device of claim 17, wherein the voice-enabled device is battery-powered.

20. The voice-enabled device of claim 17, wherein the operations occur repeatedly according to an interval, and wherein the voice-enabled device is responsive to changes in the signal from interval to interval.

* * * * *